(12) United States Patent
Flack et al.

(10) Patent No.: US 10,656,196 B2
(45) Date of Patent: *May 19, 2020

(54) UTILITY GROUND DETECTION

(71) Applicant: Webasto Charging Systems, Inc., Simi Valley, CA (US)

(72) Inventors: Albert Flack, Lake Arrowhead, CA (US); Scott Garret Berman, Los Angeles, CA (US)

(73) Assignee: Webasto Charging Systems, Inc., Monrovia, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/920,307

(22) Filed: Mar. 13, 2018

(65) Prior Publication Data
US 2018/0275186 A1 Sep. 27, 2018

Related U.S. Application Data

(63) Continuation of application No. 13/690,946, filed on Nov. 30, 2012, now Pat. No. 9,915,692, which is a (Continued)

(51) Int. Cl.
G01R 31/02 (2006.01)
H02H 5/10 (2006.01)

(52) U.S. Cl.
CPC .......... G01R 31/025 (2013.01); H02H 5/105 (2013.01)

(58) Field of Classification Search
CPC ............................. G01R 31/025; H02H 5/105
See application file for complete search history.

(56) References Cited

U.S. PATENT DOCUMENTS 3,700,966 A 10/1972 Morrow
3,757,169 A 9/1973 Beresnikow
(Continued)

FOREIGN PATENT DOCUMENTS

CN 1154161 A 7/1997
CN 1499211 A 5/2004
(Continued)

OTHER PUBLICATIONS

International Searching Authority; International Search Report (ISR) for corresponding PCT case application No. PCT/US2011/038776 entitled Utility Ground Detection by Flack et al.; dated Sep. 27, 2011 from U.S. International Searching Authority; 2 pgs.
(Continued)

Primary Examiner — Patrick Assouad
Assistant Examiner — Feba Pothen
(74) Attorney, Agent, or Firm — Christopher R. Balzan, Esq.; Eric J. Aagaard, Esq.

(57) ABSTRACT

In an embodiment, a missing utility ground detection circuit includes a pair of balanced resistors each connected to receive utility voltage from a different one of a pair of utility power lines, the balanced resistors being connected together at a summing node to be capable of summing the voltages from the pair of utility power lines. It includes an unbalance resistor connected to shunt voltage from one of the utility power lines. It has a summing amplifier with an input coupled to the summing node and to a reference voltage, and an input coupled to a second reference voltage. It has an averaging circuit connected at the output of the summing amplifier. A comparator is provided having an input connected to the averaging circuit an input connected to a threshold voltage.

34 Claims, 6 Drawing Sheets

Related U.S. Application Data continuation of application No. PCT/US2011/038776, filed on Jun. 1, 2011.

(60) Provisional application No. 61/350,459, filed on Jun. 1, 2010.

(56) References Cited

U.S. PATENT DOCUMENTS

| | | | |
|---|---|---|---|
| 3,953,767 A | 4/1976 | Ahmed | |
| 4,037,155 A | 7/1977 | Ahmed | |
| 4,104,687 A * | 8/1978 | Zulaski | H02H 3/36 361/15 |
| 5,481,194 A | 1/1996 | Schantz et al. | |
| 5,914,843 A | 6/1999 | Hopkins et al. | |
| 6,107,611 A | 8/2000 | Jones | |
| 6,448,856 B2 | 9/2002 | Noro et al. | |
| 6,577,478 B2 | 6/2003 | Kim et al. | |
| 6,950,764 B2 | 9/2005 | Ennis et al. | |
| 6,977,518 B2 | 12/2005 | Higashihama et al. | |
| 7,113,031 B2 | 9/2006 | Rabary et al. | |
| 7,224,559 B2 | 5/2007 | Henze et al. | |
| 7,369,045 B2 | 5/2008 | Hansen | |
| 7,609,080 B2 | 10/2009 | Miller et al. | |
| 7,660,088 B2 | 2/2010 | Mooney et al. | |
| 8,390,967 B2 | 3/2013 | Goto | |
| 2003/0171884 A1 | 9/2003 | Ennis et al. | |
| 2003/0189804 A1 | 10/2003 | Kampmeyer | |
| 2005/0122140 A1 | 6/2005 | Peker | |
| 2006/0217906 A1 | 9/2006 | Barbara et al. | |
| 2009/0020346 A1 | 1/2009 | Krauer et al. | |
| 2009/0190280 A1 | 7/2009 | Daio et al. | |
| 2013/0119933 A1 | 5/2013 | Flack et al. | |

FOREIGN PATENT DOCUMENTS

| | | |
|---|---|---|
| CN | 1910813 A | 2/2007 |
| CN | 1989673 A | 6/2007 |

OTHER PUBLICATIONS

International Searching Authority; Written Opinion of the International Searching Authority (WO) for corresponding PCT/US2011/038776 entitled Utility Ground Detection by Flack et al.; dated Sep. 27, 2011 from U.S. International Searching Authority; 6 pgs.

International Searching Authority; Examiner's Search History (Exam_Search_History) for corresponding PCT case application No. PCT/US2011/038776 entitled Utility Ground Detection by Flack et al.; completed Sep. 7, 2011 from U.S. International Searching Authority; 14 pgs.

The State Intellectual Property Office of the People's Republic of China (SIPO); English translation of First Office Action (OA1) for corresponding case Chinese application No. 201180038071.5 entitled Utility Ground Detection by Albert Flack et al.; dated Jun. 27, 2014, from The State Intellectual Property Office of the People's Republic of China; 15 pgs.

The State Intellectual Property Office of the People's Republic of China (SIPO); English translation of the Search Report (Search_Rpt) for corresponding case Chinese application No. 201180038071.5 entitled Utility Ground Detection by Albert Flack et al.; dated Jun. 20, 2014, from The State Intellectual Property Office of the People's Republic of China; 2 pgs.

International Searching Authority; International Search Report (ISR) for related PCT case application No. PCT/US2011/032576 entitled Ground Fault Interrupt Circuit for Electric Vehicle by Flack et al.; dated Jun. 22, 2011 from U.S. International Searching Authority; 2 pgs.

International Searching Authority; Written Opinion of the International Searching Authority (WO) for related case application No. PCT/US2011/032576 entitled Ground Fault Interrupt Circuit for Electric Vehicle by Flack et al.; dated Jun. 22, 2011 from U.S. International Searching Authority; 9 pgs.

International Searching Authority; Examiner's Search History (Exam_Search_History) for related PCT case application No. PCT/US2011/032576 entitled Ground Fault Interrupt Circuit for Electric Vehicle by Flack et al.; completed Jun. 11, 2011 from U.S. International Searching Authority; 4 pgs.

The State Intellectual Property Office of the People's Republic of China (SIPO); English translation of First Office Action (OA1) for related case Chinese application No. 201180029413.7 entitled Ground Fault interrupt Circuit for Electric Vehicle by Albert Flack et al.; dated Jun. 26, 2014, from The State Intellectual Property Office of the People's Republic of China; 15 pgs.

The State Intellectual Property Office of the People's Republic of China (SIPO); English translation of Search Report (Search_Rpt) for related case Chinese application No. 201180029413.7 entitled Ground Fault Interrupt Circuit for Electric Vehicle by Albert Flack et al.; dated Jun. 17, 2014, from The State Intellectual Property Office of the People's Republic of China; 3 pgs.

The State Intellectual Property Office of the People's Republic of China (SIPO); English translation of Second Office Action (OA2) for related case Chinese application No. 201180029413.7 entitled Ground Fault Interrupt Circuit for Electric Vehicle by Albert Flack et al.; dated Apr. 3, 2015, from The State Intellectual Property Office of the People's Republic of China; 4 pgs.

The State Intellectual Property Office of the People's Republic of China (SIPO); English translation of Second Office Action (OA2) for corresponding case Chinese application No. 201180038071.5 entitled Utility Ground Detection by Albert Flack et al.; dated Apr. 16, 2015, from The State Intellectual Property Office of the People's Republic of China; 4 pgs.

The State Intellectual Property Office of the People's Republic of China (SIPO); English translation of Third Office Action (OA3) for corresponding case Chinese application No. 201180038071.5 entitled Utility Ground Detection by Albert Flack et al.; dated Dec. 18, 2015, from The State Intellectual Property Office of the People's Republic of China; 4 pgs.

The State Intellectual Property Office of the People's Republic of China (SIPO); English translation of Third Office Action (OA3) for related case Chinese application No. 201180029413.7 entitled Ground Fault Interrupt Circuit for Electric Vehicle by Albert Flack et al.; dated Oct. 19, 2015, from The State Intellectual Property Office of the People's Republic of China; 4 pgs.

The State Intellectual Property Office of the People's Republic of China (SIPO); English translation of First Office Action (OA1) for corresponding divisional case Chinese application No. 201610597682.8 entitled Utility Ground Detection by Albert Flack et al.; dated May 2, 2018, from The State Intellectual Property Office of the People's Republic of China; 4 pgs.

The State Intellectual Property Office of the People's Republic of China (SIPO); Search Report (Search_Rpt) for corresponding divisional case Chinese application No. 201610597682.8 entitled Utility Ground Detection by Albert Flack et al.; dated Apr. 22, 2018, from The State Intellectual Property Office of the People's Republic of China; 1 pg.

The State Intellectual Property Office of the People's Republic of China (SIPO); English translation of Fourth Office Action (OA4) for related case Chinese application No. 201180029413.7 entitled Ground Fault Interrupt Circuit for Electric Vehicle by Albert Flack et al.; dated Apr. 22, 2016, from The State Intellectual Property Office of the People's Republic of China; 4 pgs.

USPTO Non-Final Office Action (NFOA) dated May 7, 2015 for related U.S. Appl. No. 13/651,417, entitled Ground Fault Interrupt Circuit for Electric Vehicle by Flack et al.

Response to USPTO Non-Final Office Action (R-NFOA) dated May 7, 2015 filed Nov. 19, 2015 for related U.S. Appl. No. 13/651,417, entitled Ground Fault Interrupt Circuit for Electric Vehicle by Flack et al.

USPTO Final Office Action (FOA) dated Feb. 10, 2016 for related U.S. Appl. No. 13/651,417, entitled Ground Fault Interrupt Circuit for Electric Vehicle by Flack et al.

Response to USPTO Final Office Action (R-FOA) dated Feb. 10, 2016 filed Aug. 10, 2016 for related U.S. Appl. No. 13/651,417, entitled Ground Fault Interrupt Circuit for Electric Vehicle by Flack et al.

(56) References Cited

OTHER PUBLICATIONS

USPTO Non-Final Office Action (NFOA2) dated Oct. 3, 2016 for related U.S. Appl. No. 13/651,417, entitled Ground Fault Interrupt Circuit for Electric Vehicle by Flack et al.

* cited by examiner

UTILITY GROUND DETECTION

CROSS REFERENCE TO RELATED APPLICATIONS

This application is a continuation of U.S. patent application Ser. No. 13/690,946, by Flack et al., entitled UTILITY GROUND DETECTION, filed Nov. 30, 2012, which is a continuation of PCT Application No. PCT/US2011/038776, by Flack et al., entitled UTILITY GROUND DETECTION, filed 1 Jun. 2011, which claims the benefit of U.S. Provisional Application No. 61/350,459, filed on Jun. 1, 2010, by Flack et al., entitled UTILITY GROUND DETECTION, all herein incorporated by reference in their entireties.

BACKGROUND

One way to charge an electric vehicle is to supply the vehicle with utility power so that a charger in the vehicle can charge the battery in the vehicle. If there is missing ground at the utility power, or it is not supplied to the car, the car can become charged. If someone is touching car while grounded, that person could be shocked.

What is needed is a way to detect the absence of utility ground. In a further embodiment what is needed is a way to detect the absence of utility ground without false indications.

SUMMARY

In one possible embodiment, a missing utility ground detection circuit is provided which includes a pair of balanced resistors each connected to receive utility voltage from a different one of a pair of utility power lines, the balanced resistors being connected together at a summing node to be capable of summing the voltages from the pair of utility power lines. The missing utility ground detection circuit includes an unbalance resistor connected so as to shunt voltage from one of the utility power lines. The missing utility ground detection circuit has a summing amplifier with a first input coupled to the summing node and to a first reference voltage and a second input coupled to a second reference voltage. The missing utility ground detection circuit has an averaging circuit connected at the output of the summing amplifier. A comparator is provided having a first input connected to the averaging circuit a second input connected to a threshold voltage.

In some embodiments, the unbalance resistor may be connected between a utility power line input and ground.

In some embodiments, the first input of the summing amplifier is also connected to a reference voltage, which may be via an offset resistor. In some embodiments, the second input of the summing amplifier may be connected to ground and the first input of the summing amplifier connected to receive a positive reference voltage via an offset resistor.

In other embodiments a diode, for example a Zener diode, may be connected between first input of the summing amplifier and the balanced resistors. The diode may be in place of the reference voltage and offset resistor.

In some further embodiments, the second input of the comparator may be connected between threshold resistors, the threshold resistors being connected to each other in series, the threshold resistors being connected between ground and a reference voltage. In some embodiments, a feedback resistor may be provided connected between the second input of the comparator and an output of the comparator.

In one possible embodiment, a missing utility ground detection circuit is provided which includes a summing amplifier having the inverting input connected to receive utility voltage via balanced resistors and a reference voltage via a shunt connected offset resistor. The non-inverting input is connected to receive a reference voltage. An unbalance resistor is connected in shunt between a utility power line input and a reference voltage. A filter is connected to the output of the summing amplifier. Also included is a comparator with the inverting input connected to an output of the filter and the non-inverting input connected to receive a threshold voltage. An optional feedback resistor may be connected between the non-inverting input of the comparator and the output of the comparator.

In some embodiments, the non-inverting input of the summing amplifier is connected to ground and the inverting input of the summing amplifier is connected to receive a positive reference voltage via the shunt connected offset resistor.

In one possible embodiment, a missing utility ground detection circuit is provided which includes a summing amplifier having the inverting input connected to received utility voltage via a Zener diode connected in series with parallel connected balanced resistors each connected to a utility power input. The non-inverting input is connected to a reference voltage. An unbalance resistor is connected in shunt between a utility power line input and a reference voltage. A filter is connected to the output of the summing amplifier. Also included is a comparator with the inverting input connected to an output of the filter and the non-inverting input connected to receive a threshold voltage. An optional feedback resistor may be connected between the non-inverting input of the comparator and the output of the comparator.

In one possible implementation, a method is provided for detecting a missing utility ground in utility voltage inputs. The method may include offsetting one of the utility voltage inputs, sensing and summing the offset utility voltage and the other of the utility voltage inputs, and comparing the summed voltages to a threshold voltage to provide a compared output. The compared output is averaged. The averaged output is then compared to a threshold voltage to provide a ground fault signal.

Some implementations, further include controlling a utility power contactor using the ground fault signal as an input to determine whether to at least one of open or close the utility power contactor so as to at least one of supply or inhibit utility power to an AC output.

Some implementations include combining the summed voltages with an offset voltage prior to comparing the summed voltages to a threshold voltage. In some implementations offsetting the voltage includes offsetting with a positive voltage.

An alternate implementation includes rectifying the summed voltages prior to comparing the summed voltages to a threshold voltage to provide the compared output. In some implementations, rectifying included using a Zener diode.

In one implementation, the sensing is performed using balanced resistors.

In one implementation, averaging includes filtering the compared output using a series resistor and shunt capacitor.

Some implementations include feeding back a portion of ground fault signal and combining it with the threshold voltage such that the averaged output is compared to the combined threshold voltage and feedback portion of the ground fault signal to provide the ground fault signal.

BRIEF DESCRIPTION OF THE DRAWINGS

The features and advantages of the present invention will be better understood with regard to the following description, appended claims, and accompanying drawings where:

DESCRIPTION

Figure 4:
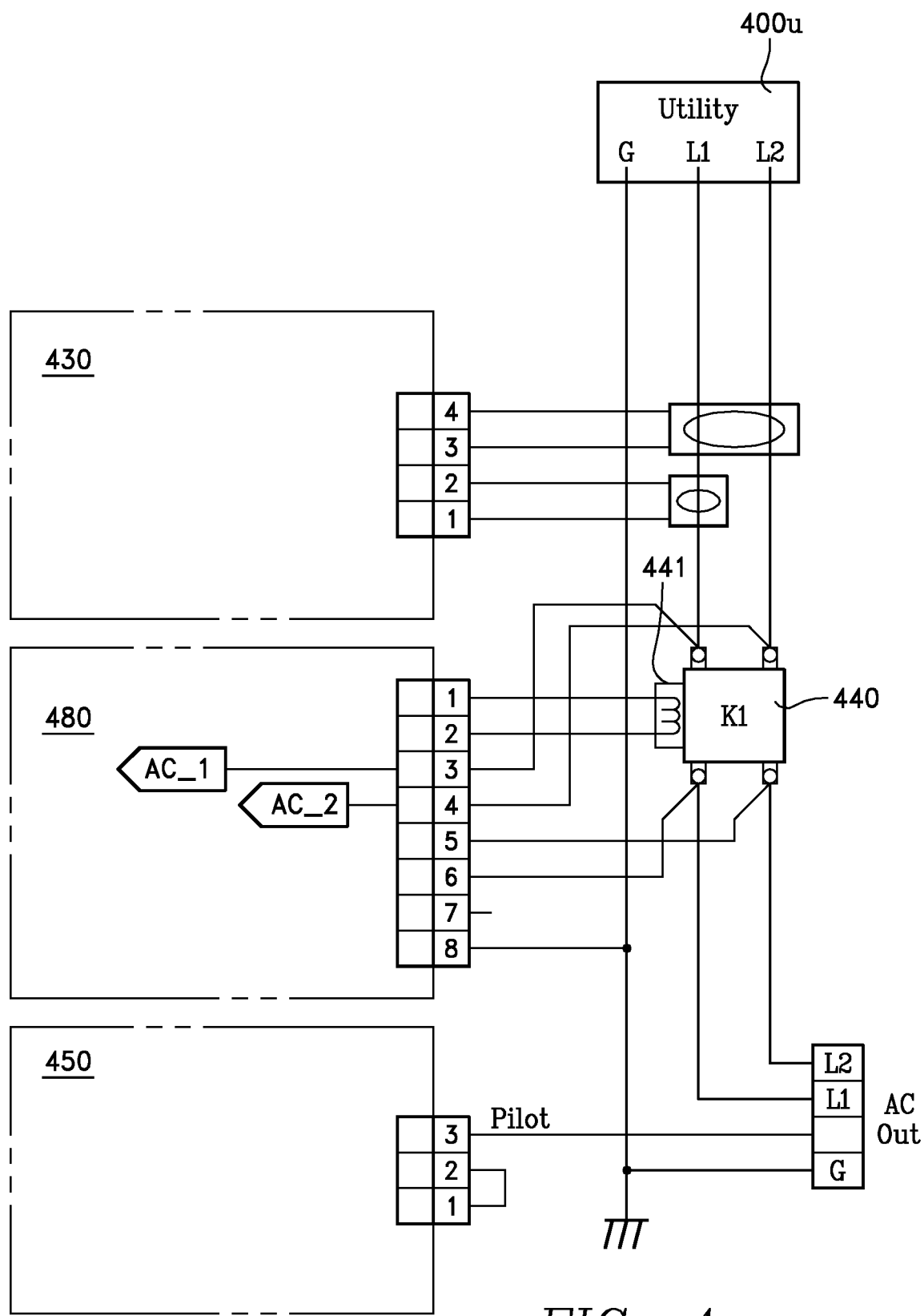
FIG. 4 shows a schematic view of a cable to connect utility power to an electric vehicle (not shown) along with some associated circuitry.
Figure 5:
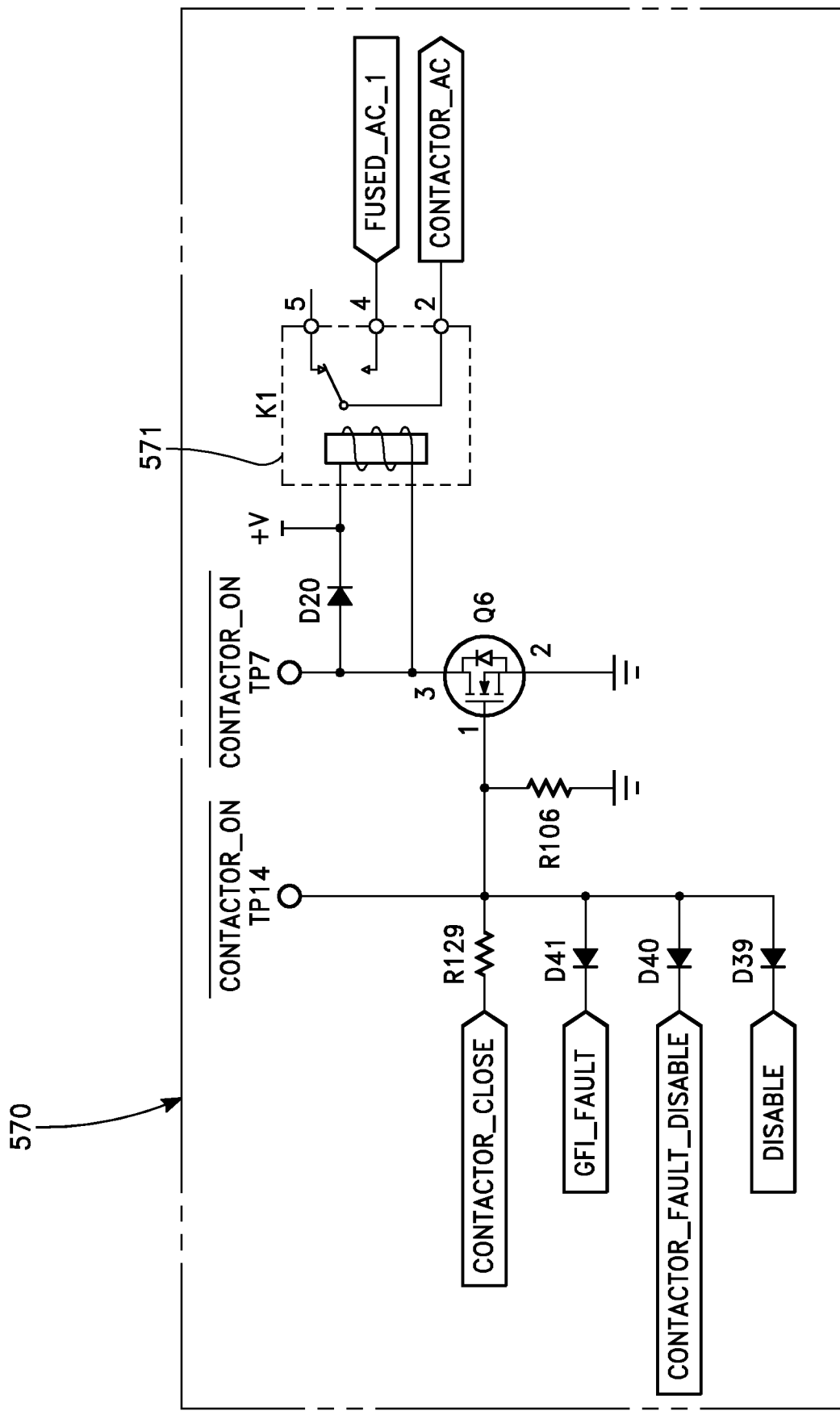
FIG. 5 shows a schematic view of a contactor control circuit.

When the ground is a true ground it will read zero. When the ground is a 3 phase midpoint (neutral), the neutral will fluctuate sinusoidally. One purpose of various embodiments of the missing utility ground circuit 10 (FIG. 1) is to identify whether the midpoint of the voltages L1 and L2 (FIG. 4) is tied to ground. The two voltages L1 and L2 represent the two phases with respect to ground/neutral. The two voltage sources L1 and L2 are 180 degrees out of phase if it is single phase (240V), or 120 degrees if it is three phase (208V). The signals AC_1 and AC_2 shown in FIG. 1 are the utility power voltages L1 and L2 (FIG. 4), respectively.

Figure 1:
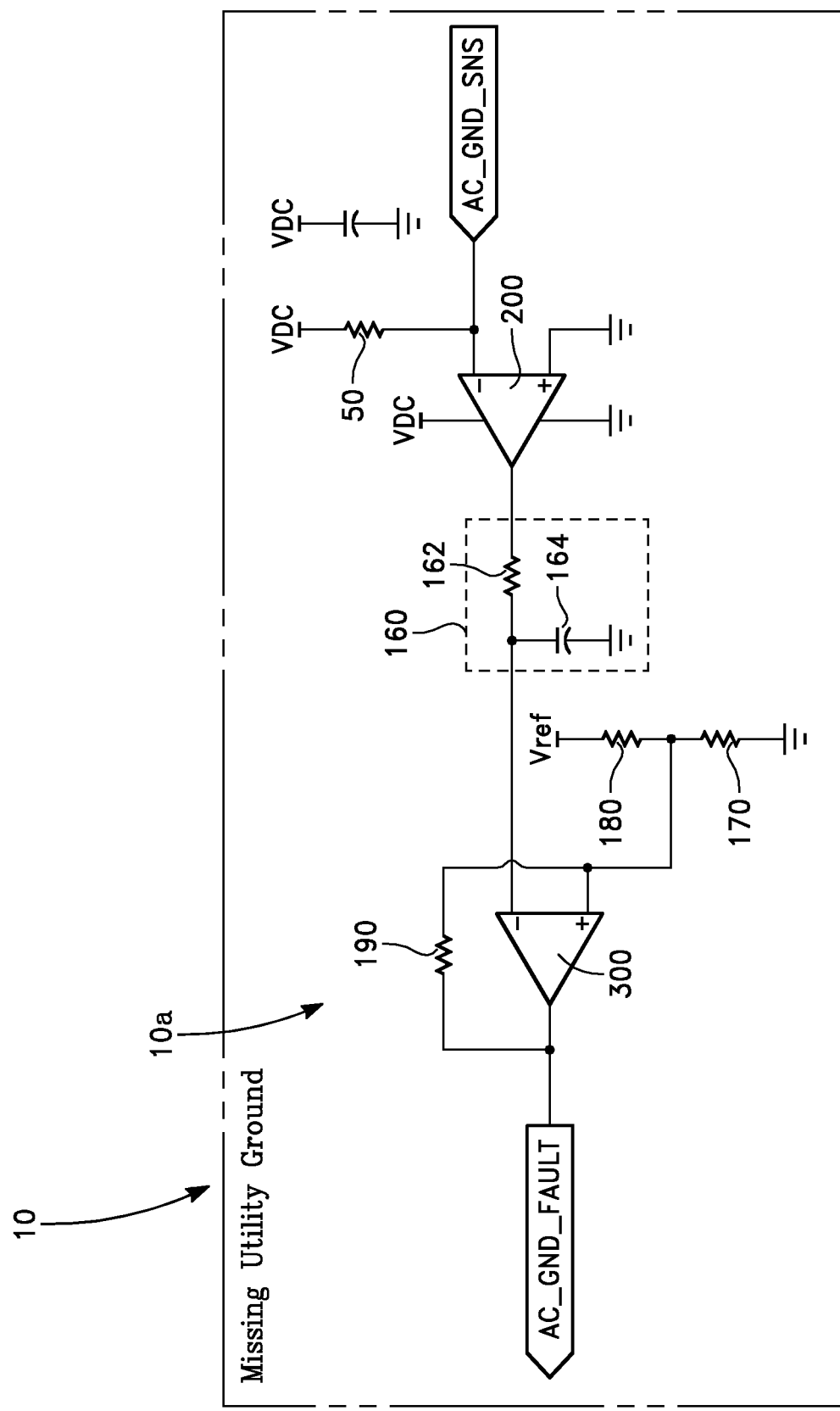
FIG. 1 shows a simplified schematic view of one possible embodiment of the missing utility ground detection circuit.
Figure 3:
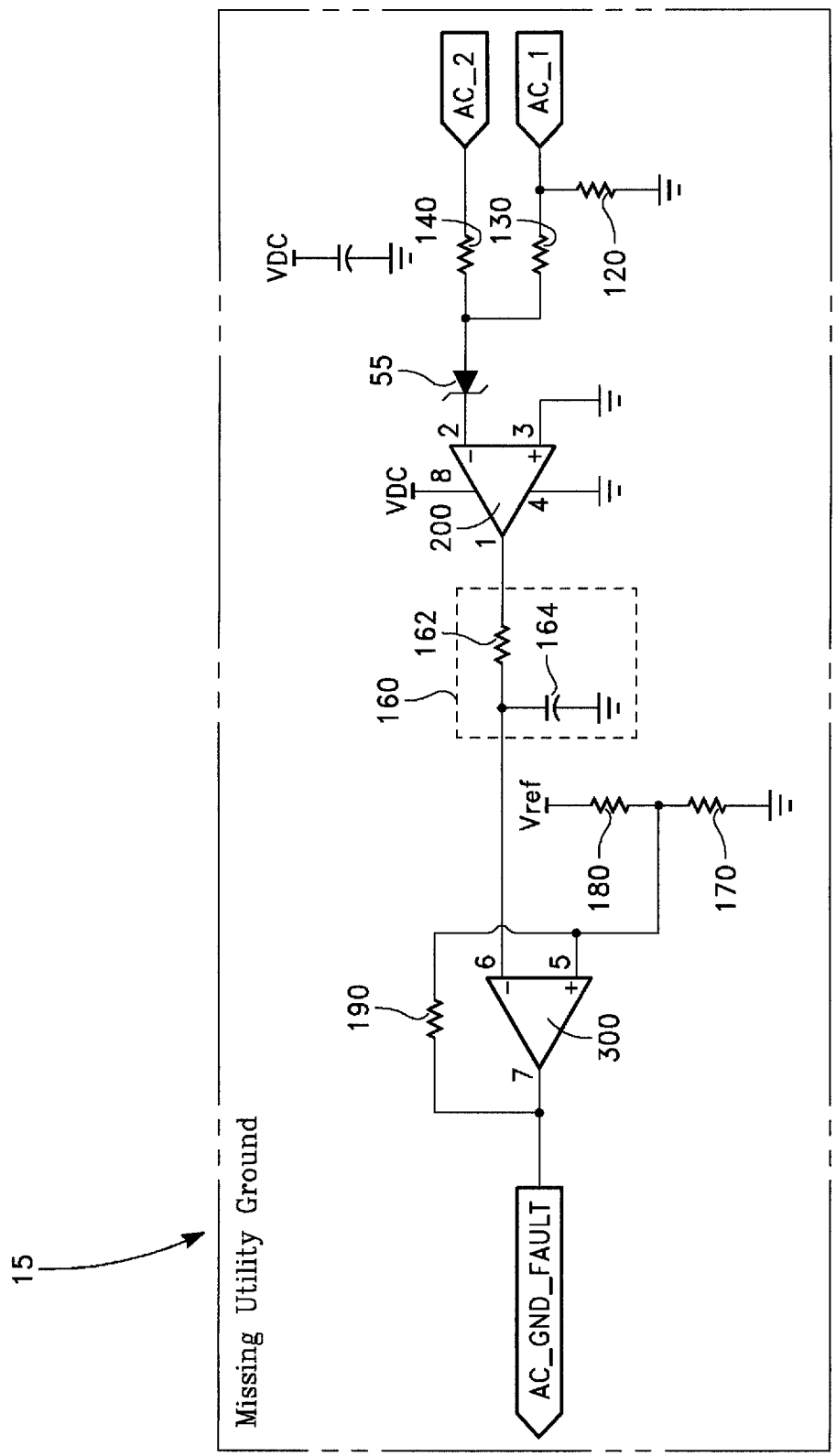
FIG. 3 shows a simplified schematic view of another possible embodiment of the missing utility ground detection circuit using a Zener diode.

FIG. 1 shows a simplified schematic view of one possible embodiment of the missing utility ground detection circuit 10. Amplifier 200 is referred to as a summing amplifier 200 herein because the inverting input 2 of the amplifier 200 is a summing node, as discussed below. The summing amplifier 200 functions as a comparator as it is a single supply amplifier with no feedback resistor, so has no net gain. If the inverting input 2 of the summing amplifier 200 is below the non-inverting input 3 the output 1 goes high. If the inverting input 2 of the summing amplifier is above the non-inverting input 3 the output 1 goes low. In the embodiment shown in FIG. 1, VDC is 3.3V. As shown in FIGS. 1 and 3, VDC may be coupled to ground via a capacitor if desired, for example a 0.1 microfarad capacitor.

Figure 2:
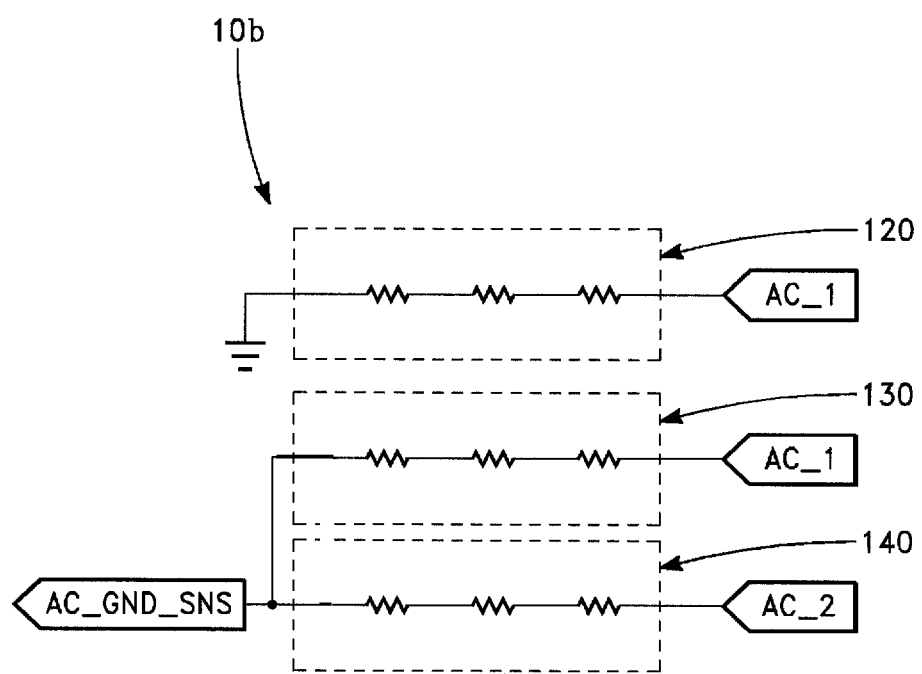
FIG. 2 shows a simplified schematic view of portion of the missing utility ground detection circuit of FIG. 1, showing balanced summing resistors for utility power L1 (AC_1) and L2 (AC_2), and an unbalance resistor.

FIG. 2 shows a simplified schematic view of portion 10b of the missing utility ground detection circuit 10 of FIG. 1, showing balanced summing resistors 130 and 140 for utility power L1 (AC_1) and L2 (AC_2), and an unbalance resistor 120. Shown in FIG. 2, the AC_1 signal is connected to ground via unbalance resistor 120. The unbalance resistor 120 in this example is 60K ohms, which is shown as three 20 k ohm 1 Watt resistors in series. The AC_1 and AC_2 signals are connected to the inverting input 2 of the summing amplifier 200 via balanced sense resistors 130 and 140, respectively. Thus, the AC_1 signal is connected to the inverting input 2 of the summing amplifier 200 via a balanced sense resistor 130, which is 3M ohms, shown as three 1M ohm resistors in series in this example, and the AC_2 signal is connected to the inverting input 2 of the summing amplifier 200 via the balanced sense resistor 140, which is also 3M ohms, shown as three 1M ohm resistors in series in this example. An offset resistor 50 is also connected between the inverting input 2 of the summing amplifier 200 and the reference voltage VDC. The offset resistor is 49.9K ohms and its reference voltage VDC is +3.3V in this example. The non-inverting input 3 of the summing amplifier is connected to ground.

When the missing utility ground circuit 10 is connected to three phase utility power the summation does not add up to zero, but is shifted a small amount. For higher voltage, i.e. 240V three phase, this can cause an improper fault signal, AC_GND_FAULT. To inhibit an AC_GND_FAULT on a small amount of sinusoidal voltage, and only indicate AC_GND_FAULT for the larger amount of voltage characteristic of a missing utility ground, the offset resistor 50 is used to offset the measurement so that there are not improper AC_GND_FAULT indications. The summing amplifier 200 half wave rectifies the summation, and the offset resistor 50 offsets the voltage in the positive direction.

In operation, if there is no utility ground present, the unbalance resistor 120 pulls the line voltage toward the ground/common of the circuit, i.e. the circuit board ground. If there is no utility ground, the unbalance resistor 120 pulls the voltage at the inverting input 2 of the summing amplifier 200, it causes the output 1 of the summing amplifier 200 to pulse. A filter circuit 160 averages the pulses from the output 1 of the summing amplifier 200 and provides them to comparator 300 (i.e. an operational amplifier functioning as the comparator 300). The filter circuit 160 has a series resistor 162, connected in series with the inverting input 6 of the comparator 300. The filter 160 also has a capacitor 164 connected in parallel to ground between the resistor 162 and the inverting input 6 of the comparator 300. In this example, the resistor 162 is 1 M ohm and the capacitor 164 is 1 microfarad, to form a low pass filter.

The comparator 300 compares output of the filter 160 to a threshold voltage and if the output of the filter 160 crosses the threshold voltage, the comparator 300 provides the AC_GND_FAULT signal at the output 7 of the comparator 300. Threshold resistors 170 and 180 are connected at their respective ends to ground and to a reference voltage Vref (3.0V in this example), and the other ends are connected together and to the non-inverting input 5 of the comparator 300 to provide the threshold voltage. The threshold resistors 170 and 180 are 3.65K ohms and 49.9 K ohms, respectively. Thus, the non-inverting input 5 of the comparator 300 is connected to ground via resistor 170 and to the reference voltage Vref via resistor 180.

A feedback resistor 190 is connected from the output 7 of the comparator 300 to the non-inverting input 5 of the comparator 300. The feedback resistor 190 introduces hysteresis in the comparison to shift the threshold of detection, though in various embodiments the circuit 10 will trip on the first occurrence of the fault which is then latched, so oscillation of the AC_GND_FAULT is not a factor in such embodiments. In one embodiment, the feedback resistor 190 is 1 M ohm.

The offset resistor 50 pushes the output 1 of the summing amplifier 200 toward ground so that the comparator 300 does not trip improperly on three phase power that actually has a ground. As the supply voltages increase, i.e. 240V and above, the amplitude of the sinusoidal voltage increases, which increases the likelihood of an improper AC_

GND_FAULT. With three phase power of about 240V or greater, the circuit 10 would not work reliably without the offset resistor 50.

The summing amplifier 200 and the comparator 300 may both be operation amplifiers, for example type LMV342IDR, supplied by Texas Instruments, of Dallas, Tex.

In the circuit 10, the specific values, or components may be varied. In the specific example discussed herein with provide an AC_GND_FAULT will occur if the ground is missing, or is above about 200 K to 500 K ohms.

In an alternate embodiment (FIG. 3), a Zener diode 55 could be inserted before the inverting input of the summing amplifier 200, instead of having the offset resistor 50 (FIG. 1). In such an embodiment, the Zener diode 55 would be inserted in series between the network of balanced sense resistors 130 and 140 and the inverting input 2 of the summing amplifier 200. Thus, the AC_GND_SNS signal from the would be passed through the Zener diode 55 prior to entering the inverting input 2 of the summing amplifier 200.

In yet another embodiment (not show), a detector, or indicator, i.e. board level jumper, dip switch, etc. may used to identify the characteristic of the utility power, i.e. 240, 208, three phase, single phase, etc. If three phase 240V or greater is used, the voltage of the utility may be detected to determine whether the utility voltage is over a threshold level, i.e. there is a utility over voltage. If there is an overvoltage, the AC_GND_FAULT may not be valid and may be a false trip.

In various embodiments, the fact that an over-voltage may cause a false trip is an inconvenience, but is easily recoverable. When the false missing ground fault is detected, then the CPU (not shown) can determine whether the over voltage may have caused it, and therefore handle the fault response differently. In various embodiments, this is a "collateral" fault detection in that both faults, missing ground and overvoltage, may be detected. The over voltage threshold for this fault can be adjusted by component selection to make use of it, or extend it, more out of trip range.

Figure 6:
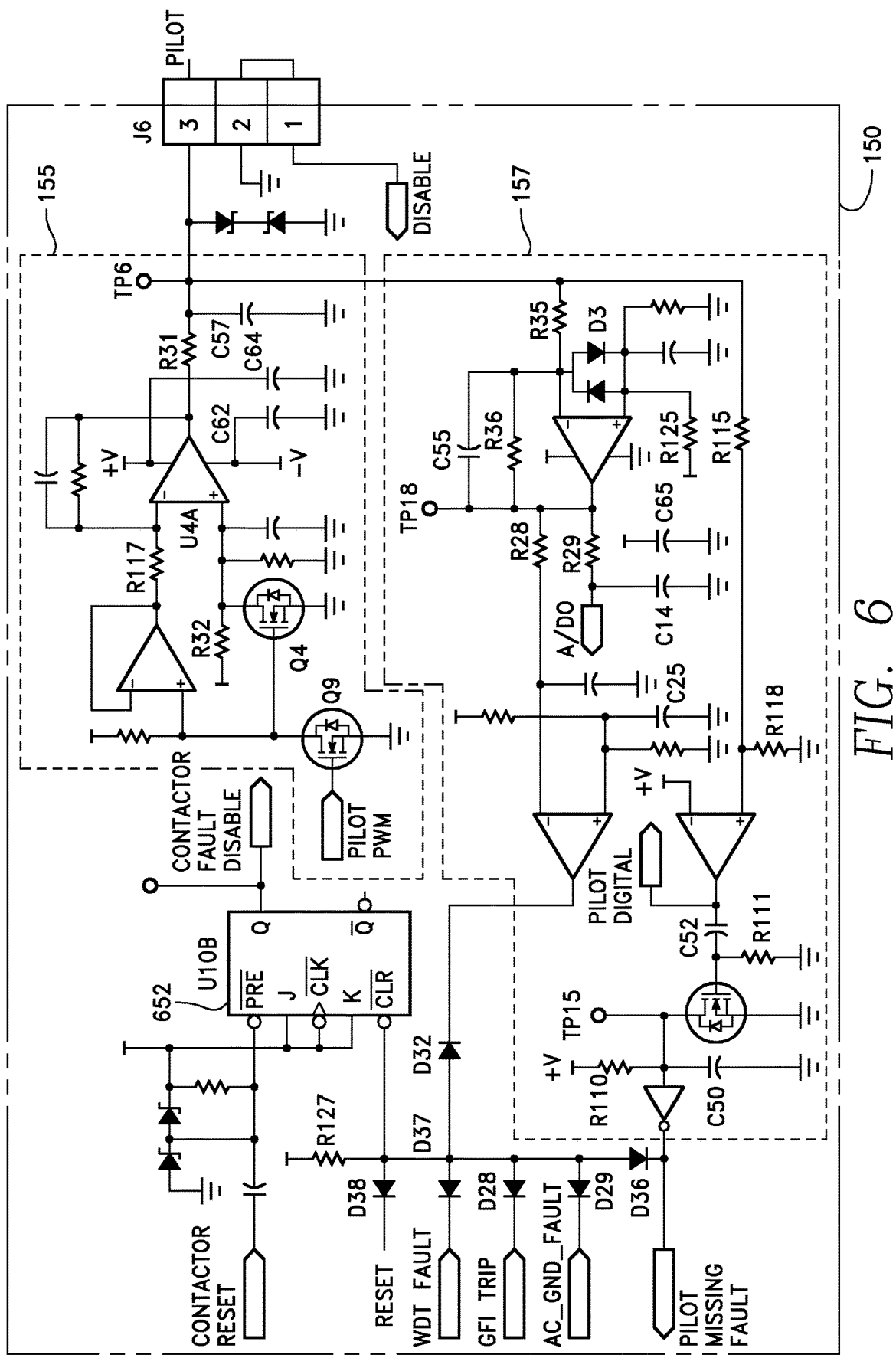
FIG. 6 shows an enlarged more complete schematic of the pilot circuitry shown in partial schematic in FIG. 4.

Referring to FIGS. 1-6, in one of many possible embodiments, when the utility ground G (FIG. 4) is not present, the line to ground balance set up by the balanced resistive reference 130 (FIG. 2) and 140 (FIG. 2) will become unbalanced due to the resistive leg 120 (FIG. 2) across one phase to ground. This will create a non-zero voltage at the summing node at the inverting input 2 of the comparator 200 (FIG. 1), which will charge up the reservoir capacitor 164 (FIG. 1) over time and trip the comparator 300 (FIG. 1) to provide the AC_GND_FAULT (FIGS. 1 and 6). The AC_GND_FAULT (FIGS. 1 and 6) signal may be used to latch the contactor-disable flip-flop 652 (FIG. 6) and disable the contactor driver 570 (FIG. 5) from closing the contactor relay 140 (FIG. 571) and therefore the contactor 440 (FIG. 4), the operation of which are further disclosed in PCT Application PCT/US11/032576, filed Apr. 14, 2011, entitled GROUND FAULT INTERRUPT CIRCUIT FOR ELECTRIC VEHICLE, by Flack, which claims the benefit of Provisional Application Ser. No. 61/324,296, filed Apr. 14, 2010, entitled GROUND FAULT INTERRUPT CIRCUIT FOR ELECTRIC VEHICLE, by Flack, both herein incorporated by reference in their entireties.

It is worthy to note that any reference to "one embodiment" or "an embodiment" means that a particular feature, structure, or characteristic described in connection with the embodiment may be included in an embodiment, if desired. The appearances of the phrase "in one embodiment" in various places in the specification are not necessarily all referring to the same embodiment. Further the feature(s) of various embodiments may be included in other embodiments.

The illustrations and examples provided herein are for explanatory purposes and are not intended to limit the scope of the appended claims. This disclosure is to be considered an exemplification of the principles of the invention and is not intended to limit the spirit and scope of the invention and/or claims of the embodiment illustrated.

Those skilled in the art will make modifications to the invention for particular applications of the invention.

The discussion included in this patent is intended to serve as a basic description. The reader should be aware that the specific discussion may not explicitly describe all embodiments possible and alternatives are implicit. Also, this discussion may not fully explain the generic nature of the invention and may not explicitly show how each feature or element can actually be representative or equivalent elements. Again, these are implicitly included in this disclosure. Where the invention is described in device-oriented terminology, each element of the device implicitly performs a function. It should also be understood that a variety of changes may be made without departing from the essence of the invention. Such changes are also implicitly included in the description. These changes still fall within the scope of this invention.

Further, each of the various elements of the invention and claims may also be achieved in a variety of manners. This disclosure should be understood to encompass each such variation, be it a variation of any apparatus embodiment, a method embodiment, or even merely a variation of any element of these. Particularly, it should be understood that as the disclosure relates to elements of the invention, the words for each element may be expressed by equivalent apparatus terms even if only the function or result is the same. Such equivalent, broader, or even more generic terms should be considered to be encompassed in the description of each element or action. Such terms can be substituted where desired to make explicit the implicitly broad coverage to which this invention is entitled. It should be understood that all actions may be expressed as a means for taking that action or as an element which causes that action. Similarly, each physical element disclosed should be understood to encompass a disclosure of the action which that physical element facilitates. Such changes and alternative terms are to be understood to be explicitly included in the description.

Having described this invention in connection with a number of embodiments, modification will now certainly suggest itself to those skilled in the art. The example embodiments herein are not intended to be limiting, various configurations and combinations of features are possible. As such, the invention is not limited to the disclosed embodiments, except as required by the appended claims.

What is claimed is:

1. A missing utility ground detection circuit comprising:
   a) a pair of balanced resistors each connected to receive utility power from a different one of a pair of utility power lines, the balanced resistors being connected together at a summing node to be capable of summing a utility voltage from the pair of utility power lines;
   b) an unbalance resistor connected in parallel with one of the balanced resistors from only one line of the pair of utility power lines;

c) a summing amplifier comprising:
   1) a first input coupled to the summing node;
   2) a second input coupled to a second reference voltage; and
   3) an output;
d) an averaging circuit connected at the output of the summing amplifier; and
e) a comparator comprising a first input connected to the averaging circuit a second input connected to a threshold voltage.

2. The circuit of claim 1, wherein the first input of the summing amplifier is further connected to a reference voltage.

3. The circuit of claim 2, wherein the unbalance resistor is connected between the only one line of the pair of utility power lines input and ground.

4. The circuit of claim 2, wherein the first input of the summing amplifier is connected to the reference voltage via an offset resistor.

5. The circuit of claim 2, wherein the second input of the comparator is connected between threshold resistors, the threshold resistors being connected to each other in series, the threshold resistors being connected between ground and a reference voltage.

6. The circuit of claim 5 further comprising a feedback resistor connected between the second input of the comparator and an output of the comparator.

7. The circuit of claim 2 further comprising a feedback resistor connected between the second input of the comparator and an output of the comparator.

8. The circuit of claim 2, wherein the second input of the summing amplifier is connected to ground, and wherein the first input of the summing amplifier is connected to receive a positive reference voltage via an offset resistor.

9. The circuit of claim 1 further comprising a diode connected between the first input of the summing amplifier and the balanced resistors.

10. The circuit of claim 9, wherein the diode is a Zener diode.

11. The circuit of claim 9, wherein the unbalance resistor is connected between the only one line of the pair of utility power lines input and ground.

12. The circuit of claim 9, wherein the second input of the comparator is connected between threshold resistors, the threshold resistors being connected to each other in series, the threshold resistors being connected between ground and a reference voltage.

13. The circuit of claim 12 further comprising a feedback resistor connected between the second input of the comparator and an output of the comparator.

14. The circuit of claim 9 further comprising a feedback resistor connected between the second input of the comparator and an output of the comparator.

15. A missing utility ground detection circuit comprising:
a) a summing amplifier comprising:
   (i) an inverting input connected to receive utility voltage via balanced resistors and a reference voltage via a parallel connected offset resistor;
   (ii) a non-inverting input connected to receive a reference voltage;
   (iii) an output;
b) an unbalance resistor connected in parallel with one of the balanced resistors between only one utility power line input and a reference voltage;
c) a filter having an input connected to the output of the summing amplifier; and
d) a comparator comprising:
   (i) an inverting input connected to an output of the filter; and
   (ii) a non-inverting input connected to receive a threshold voltage.

16. The circuit of claim 15, a feedback resistor connected between the non-inverting input of the comparator and an output of the comparator.

17. The circuit of claim 15, wherein the non-inverting input of the summing amplifier is connected to ground, and wherein the inverting input of the summing amplifier is connected to receive a positive reference voltage via the parallel connected offset resistor.

18. The circuit of claim 15, wherein the unbalance resistor is connected between the only one utility power line input and ground.

19. The circuit of claim 15, wherein the non-inverting input of the comparator is connected between threshold resistors, the threshold resistors being connected to each other in series, the threshold resistors being connected between ground and a reference voltage.

20. A missing utility ground detection circuit comprising:
a) a summing amplifier comprising:
   (i) an inverting input connected to receive utility voltage via a Zener diode connected in series with parallel connected balanced resistors each connected to a utility power input, respectively, the Zener diode being connected in series between the inverting input and the parallel connected balanced resistors;
   (ii) a non-inverting input connected to a reference voltage; and
   (iii) an output;
b) an unbalance resistor connected between only one utility power line input and a reference voltage;
c) a filter having an input connected to the output of the summing amplifier; and
d) a comparator comprising:
   (i) an inverting input connected to an output of the filter; and
   (ii) a non-inverting input connected to receive a threshold voltage.

21. The circuit of claim 20 further comprising a feedback resistor connected between the non-inverting input of the comparator and an output of the comparator.

22. The circuit of claim 20, wherein the non-inverting input of the summing amplifier is connected to ground.

23. The circuit of claim 20, wherein the unbalance resistor is connected between the only one utility power line input and ground.

24. The circuit of claim 20, wherein the non-inverting input of the comparator is connected between threshold resistors, the threshold resistors being connected to each other in series, the threshold resistors being connected between ground and a reference voltage.

25. A method for detecting a missing utility ground in utility voltage inputs, the method comprising:
a) unbalancing only one of the utility voltage inputs;
b) sensing and summing the unbalanced only one of the utility voltage inputs and an other of the utility voltage inputs;
c) comparing the summed voltages to a reference threshold voltage to provide a compared output;
d) averaging the compared output to provide an averaged output; and
e) comparing the averaged output to a fault threshold voltage to provide a ground fault signal.

26. The method of claim 25, further comprising feeding back a portion of ground fault signal and combining the feedback portion with the fault threshold voltage such that the averaged output is compared to a combined signal comprising the fault threshold voltage and the feedback portion to provide the ground fault signal.

27. The method of claim 25, wherein the sensing is performed using balanced resistors.

28. The method of claim 25, wherein averaging comprises filtering the compared output using a series resistor and shunt capacitor.

29. The method of claim 25, further comprising combining the summed voltages with an offset voltage prior to the comparing of the summed voltages to the reference threshold voltage to provide the compared output.

30. The method of claim 29, wherein offsetting the voltage comprises offsetting with a positive voltage.

31. The method of claim 30 further comprising controlling a utility power contactor using the ground fault signal as an input to determine whether to at least one of open or close the utility power contactor so as to at least one of supply or inhibit utility power to an AC output.

32. The method of claim 25 further comprising passing the summed voltages through a Zener diode prior to the comparing of the summed voltages to the reference threshold voltage to provide the compared output.

33. The method of claim 32 further comprising controlling a utility power contactor using the ground fault signal as an input to determine whether to at least one of open or close the utility power contactor so as to at least one of supply or inhibit utility power to an AC output.

34. The method of claim 25, further comprising controlling a utility power contactor using the ground fault signal as an input to determine whether to at least one of open or close the utility power contactor so as to at least one of supply or inhibit utility power to an AC output.

* * * * *